United States Patent
Katscher et al.

(10) Patent No.: US 7,642,775 B2
(45) Date of Patent: Jan. 5, 2010

(54) MR METHOD OF DETERMINING LOCAL RELAXATION TIME VALUES USING CALIBRATED PHANTOM

(75) Inventors: Ulrich Katscher, Norderstedt (DE); Hannes Dahnke, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 374 days.

(21) Appl. No.: 11/573,897

(22) PCT Filed: Aug. 19, 2005

(86) PCT No.: PCT/IB2005/052739

§ 371 (c)(1),
(2), (4) Date: Feb. 19, 2007

(87) PCT Pub. No.: WO2006/021920

PCT Pub. Date: Mar. 2, 2006

(65) Prior Publication Data

US 2008/0077006 A1 Mar. 27, 2008

(30) Foreign Application Priority Data

Aug. 25, 2004 (EP) ................................. 04104074

(51) Int. Cl.
*G01V 3/00* (2006.01)
(52) U.S. Cl. ...................................................... 324/307
(58) Field of Classification Search ......... 324/300–322; 600/410–435
See application file for complete search history.

(56) References Cited

U.S. PATENT DOCUMENTS

| | | | |
|---|---|---|---|
| 4,431,968 A | * | 2/1984 | Edelstein et al. ............ 324/309 |
| 4,528,510 A | | 7/1985 | Loeffler et al. |
| 4,551,678 A | | 11/1985 | Morgan et al. |
| 4,729,892 A | | 3/1988 | Beall |
| 5,390,673 A | * | 2/1995 | Kikinis ....................... 600/410 |

(Continued)

FOREIGN PATENT DOCUMENTS

EP 543468 A1 5/1993

(Continued)

OTHER PUBLICATIONS

Olsrud et al., "A two-compartment gel phantom for optimization and quality asurance in clinical BOLD fMRI", MRI 26 (2008) 279-286.*

(Continued)

*Primary Examiner*—Brij B Shrivastav
*Assistant Examiner*—Dixomara Vargas

(57) ABSTRACT

An MR method determines local relaxation time values ($T_1$, $T_2$) of an examination object (5). First, two or more MR images (3, 4) of the examination object (5) are recorded, each with different time parameter sets ($TR_1$, $TE_1$, $TR_2$, $TE_2$) of an imaging sequence. MR images (6, 7) of a phantom are likewise recorded using the same time parameter sets ($TR_1$, $TE_1$, $TR_2$, $TE_2$) of the imaging sequence. The phantom has a known spatial distribution of relaxation time values ($T_1$, $T_2$). The local relaxation time values ($T_1$, $T_2$) of the examination object (5) are determined by comparing image values of the MR images (3, 4) of the examination object (5) with image values of the MR images (6, 7) of the phantom and by assigning image values of the MR images (6, 7) of the phantom to relaxation time values ($T_1$, $T_2$) according to the known spatial distribution of relaxation time values ($T_1$, $T_2$) of the phantom.

18 Claims, 2 Drawing Sheets

U.S. PATENT DOCUMENTS

| | | | | |
|---|---|---|---|---|
| 5,578,923 | A | * | 11/1996 | Chen .......................... 324/309 |
| 5,583,437 | A | * | 12/1996 | Smith et al. ................. 324/307 |
| 5,899,857 | A | * | 5/1999 | Wilk .......................... 600/407 |
| 6,112,110 | A | * | 8/2000 | Wilk .......................... 600/407 |
| 6,566,878 | B1 | * | 5/2003 | Komura et al. .............. 324/315 |
| 6,675,035 | B1 | * | 1/2004 | Grable et al. ................ 600/411 |
| 7,235,972 | B2 | * | 6/2007 | Shah et al. .................. 324/309 |
| 7,285,954 | B2 | * | 10/2007 | Nezafat et al. .............. 324/309 |
| 7,508,205 | B2 | * | 3/2009 | Thelissen et al. ............ 324/307 |
| 2007/0198203 | A1 | * | 8/2007 | Kimura ....................... 702/85 |

OTHER PUBLICATIONS

M. Lepage et al; "Simple Methods for the Correction of T2 Maps of Phantoms", Magnetic Resonance in Medicine, vol. 46, 2001, pp. 1123-1129, XP002358422.

O. Harh et al; "MRI T1 Relaxation Time Measurement With Calibration on Phantom Samples", ACTA Pharmacutica, vol. 43, 1993, pp. 261-266, XP001207854.

SF Keevil et al; "Calibration of a 0.08 Tesla Magnetic Resonance Imager for in Vivo T1 and T2 Measurement", The British Journal of Radiology, vol. 65, 1992, pp. 438-442, XP009058428.

RJ Kkurland; "Strategies and Tactics in NMR Imaging Relaxation Time Measurements—I. Minimizing Relaxation Time Errors Due to Image Noise—the Ideal Case", Magnetic Resonace in Medicine, Xol. 2, 1985, pp. 136-158, XP009058647.

T. E. Conturo et al; "Improved Determination of Spin Density, T1 and T2 From a Three-Parameter Fit to Multiple-Delay-Multiple-Echo, (MDME) NMR Images", Phys. in Medicine and Biology, Taylor and Francis Ltd, London, GB, vol. 31, No. 12, Dec. 1986, pp. 1361-1380, XP002071923.

R. C. Boston et al; "Estimation of the Content of Fat and Parenchyma in Breast Tissue Using MRI T1 Histograms and Phantoms", Magnetic Resonance Imaging, Tarrytown, NY, vol. 23, No. 4, May 2005, pp. 591-599, XP004907892.

* cited by examiner

MR METHOD OF DETERMINING LOCAL RELAXATION TIME VALUES USING CALIBRATED PHANTOM

BACKGROUND

The invention relates to an MR method of determining local relaxation time values in an examination volume.

Moreover, the invention relates to an MR imaging device for carrying out the method and to a computer program for such an MR imaging device.

In MR imaging, as is known, nuclear magnetization within the examination volume of the MR imaging device used is located by means of temporally variable, spatially inhomogeneous magnetic fields (magnetic field gradients). The MR signals used for image reconstruction are usually recorded as a voltage, which is induced in a high-frequency coil arranged in the region of the examination volume, under the effect of a suitable sequence of switched magnetic field gradients and high-frequency pulses in the time domain. The actual image reconstruction from the recorded MR signals usually takes place by Fourier transformation of the time signals. The scanning of the spatial frequency area (so-called "k-space") assigned to the examination volume, by means of which the field of view (FOV) to be imaged and the image resolution are determined, is defined by the number, the temporal spacing, the duration and the strength of the magnetic field gradients and high-frequency pulses used. The number of phase coding steps during scanning of the k-space and thus at the same time the duration of the imaging sequence are defined as a function of the respective requirements in terms of FOV and image resolution.

From the prior art, MR imaging methods are known in which the determination of the local longitudinal and/or transverse relaxation times of the nuclear magnetization ($T_1$-, $T_2$- or $T_2^*$-relaxation) is of particular importance. The visualization and also the quantitative determination of the spatial distribution of the relaxation times are important for example when contrast agents which affect the relaxation of the nuclear magnetization are used in the MR imaging. Such contrast agents, which are based for example on gadolinium or on iron oxide, have recently been used also to track marked cells by means of MR and to locate active substances within the examination volume. The spatially resolved determination of relaxation times is also useful in functional MR imaging (fMRI). On the one hand, it is known from the prior art to record $T_1$-, $T_2$- or $T_2^*$-weighted MR images in order to visualize the spatial distribution of the relaxation times. On the other hand, for some applications, it is desirable to be able to determine the local relaxation times as accurately as possible in quantitative terms. This is the case for example in perfusion studies in which the temporal progress of the passage of a contrast agent bolus through a specific anatomical structure is studied. Another example is the measurement of the dimensions of capillary vessels and the density thereof by means of MR. Quantitative MR relaxometry can also be used for the quantitative determination of the iron content in certain internal organs (e.g. liver, lungs, brain).

One problem with MR relaxometry is that, for the spatially resolved determination of relaxation time values using conventional methods, the image recording times are undesirably long. This is due to the fact that, in conventional MR methods, usually a large number of separate MR images are recorded, specifically with different time parameter sets of the imaging sequence used. For each individual image point, the time response of the corresponding image values can then be evaluated as a function of the time parameters of the imaging sequence, such as the repetition time or the echo times for example. It is usual to determine a relaxation time value for each image point by means of a fit procedure, wherein a corresponding exponential decay function is adapted to the image values recorded in a time-dependent manner. It is also known to record $T_1$- and $T_2$-weighted MR images for different time parameter sets at the same time. From the MR images reconstructed for the different time parameter sets, the local relaxation time values are then adapted to multiexponential fit functions. In this method, in many cases the accuracy of determination of the local relaxation time values is unsatisfactory. In any case, in the conventional MR methods, in order to determine the relaxation time values, complete MR images for 5 to 10 different time parameter sets have to be recorded in order that a sufficiently large number of image values for different repetition or echo times exist for the fit procedure for each image point. If $T_1$ and $T_2$ values are to be determined at the same time, it is usually necessary, in order to achieve sufficient accuracy, to use a greater number of different time parameter sets. The image recording time is very long as a result.

SUMMARY

Based on this, it is an object of the invention to provide an MR method which allows the determination of local relaxation time values with sufficient accuracy, wherein the measurement time is to be shorter than in the methods known from the prior art.

In a first method step, at least two MR images of the examination object of interest are recorded and reconstructed, wherein each of the images is recorded with a different time parameter set of the imaging sequence used. In the MR method according to the invention, therefore, the recording of at least two MR images with different time parameter sets is thus necessary in order that the time response of the nuclear magnetization can be analyzed in order to determine the relaxation time values. In a further method step, MR images of a phantom are moreover recorded, specifically with the same imaging sequence and with the same time parameter sets as the MR images of the examination object. Here, use is made of a phantom which has a previously known spatial distribution of relaxation time values. The actual determination of the local relaxation time values of the examination object then takes place by comparing image values of the MR images of the examination object with image values of the MR images of the phantom and by assigning image values of the MR images of the phantom to relaxation time values according to the known spatial distribution of relaxation time values of the phantom. Therefore, for each time parameter set, the gray value of an image point of interest within the MR images of the examination object is compared with the gray values of the MR images of the phantom which are recorded with the same time parameter sets. Since the spatial distribution of the relaxation time values for the phantom is known, the correct relaxation time values can be assigned to the image point of interest when the gray values correspond to the MR images of the examination object.

When a suitable phantom is used, the recording of only two MR images of the examination object is sufficient to clearly determine for each image point the local relaxation time values of interest. Since, only two MR images have to be recorded, the image recording takes place much faster than in the methods known previously from the prior art. Nevertheless, at least two MR images have to be recorded in order to be able to clearly distinguish the effects of longitudinal and transverse relaxation on the image values, said effects being independent of one another.

According to one advantageous embodiment of the MR method, the MR images of the examination object and of the phantom are recorded at the same time. The phantom may be accommodated together with the examination object in the examination volume of the MR device used during the image recording operation. There is then no need for any additional measurement time for recording the MR images of the phantom. In the case of simultaneous image recording, the MR images of the phantom are, as it were, contained in the MR images of the examination object. If there is not enough space available in the examination volume of the MR device, there is of course also the possibility of recording the images of the phantom subsequently or beforehand. However, care should then be taken to ensure that the same imaging sequences with the same time parameter sets are used during the recording of the MR images of the phantom and during the recording of the MR images of the examination object.

Advantageously, the phantom has spatially separate regions having different longitudinal relaxation time values and/or different transverse relaxation time values. In order for the MR method to work, it is important that a value pair of $T_1$ and $T_2$ relaxation time values can be uniquely assigned to each image point within the MR images of the phantom. It is particularly advantageous if the phantom has regions having different longitudinal and essentially identical transverse relaxation time values. At the same time, the phantom should also have regions having different transverse and essentially identical longitudinal relaxation time values. It has proven to be particularly advantageous to use a phantom with a matrix-like arrangement of spatially separate regions, wherein each matrix element uniquely represents a specific $T_1/T_2$ value pair. In this case, by way of example, each row of the matrix is assigned a specific longitudinal relaxation time value and each column of the matrix is assigned a specific transverse relaxation time value. The range of longitudinal and transverse relaxation time values covered by the phantom and also the resolution of the relaxation time values may be defined depending on the application. It is possible, without any problem, for every conceivable application, to provide suitable phantoms with an appropriate measurement range of relaxation time values and with an appropriate resolution of the relaxation time values.

The accuracy of the method can advantageously be increased in that, in order to determine the relaxation time values, interpolation is carried out between the image values of the MR images. The phantom preferably in practice has a discrete graduation of $T_1$ and $T_2$ relaxation time values. During the recording of the MR images of the phantom, a corresponding graduation of the image values is obtained. By interpolating the image values, it is also possible to assign relaxation time values of the examination object which lie between the discrete relaxation time values of the phantom.

In order to clearly determine the local relaxation time values, the image values of the MR images of the examination object and of the phantom should be compared to one another for all the time parameter sets of the imaging sequence which are used. As already mentioned above, a clear assignment of $T_1$ and $T_2$ relaxation time values is possible only if at least two MR images both of the examination object and of the phantom are recorded and compared with one another. It is clear that the determination of relaxation time values based on only one MR image is not possible since both the longitudinal and the transverse relaxation of the nuclear magnetization have an effect on the image value amplitudes, wherein, based on an MR image recorded with only one time parameter set, it is not possible to decide whether the gray value determined for an image point of interest is to be attributed to $T_1$ or $T_2$ relaxation.

It is furthermore advantageous, to record the MR images in a manner weighted by both longitudinal and transverse relaxation times. Imaging sequences suitable for this purpose are known from the prior art. In order that the local relaxation time values can be determined clearly and as accurately as possible using the method according to the invention, both the $T_1$- and the $T_2$-weighting of the MR images recorded with the different time parameter sets should in each case be different.

The method described above for determining the local relaxation time values by assignment on the basis of the known spatial distribution of relaxation time values of the phantom can work reliably if the nuclear spin density within the examination object can be assumed to be more or less spatially constant and corresponds essentially to the nuclear spin density of the phantom. The nuclear spin density acts on the absolute image values (gray values), and this in principle has to be taken into account during assignment to the corresponding values of the phantom for determining the relaxation time values. In order thus to further improve the accuracy of the method, it may be advantageous to record and reconstruct, not just two, but rather at least three MR images both of the examination object and of the phantom, which additionally has a known spatial distribution of nuclear spin density values, wherein, in addition to the local relaxation time values, local nuclear spin density values of the examination object are determined by comparing image values of the MR images of the examination object with image values of the MR images of the phantom and by assigning image values of the MR images of the phantom to nuclear spin density values according to the known spatial distribution of nuclear spin density values of the phantom. As a result, the effect of the spatially inhomogeneous nuclear spin density is quantified and can be compensated during determination of the relaxation time values. In this advantageous embodiment, too, the method is considerably faster than conventional methods of MR relaxometry. The phantom may in this case have a tensor-like spatial arrangement of separate regions, wherein each tensor element uniquely represents a specific set of $T_1$, $T_2$ and nuclear spin density values.

It is furthermore particularly advantageous, in order to record the MR images to use a spin echo imaging sequence, such as a turbo spin echo (TSE) sequence for example, in order to rule out the effects of $T_2^*$ relaxation since the determination of $T_2^*$ relaxation time values is problematic.

In order to carry out the method, use may be made of an MR imaging device comprising recording means for recording MR signals and computer means for reconstructing MR images from the MR signals and for determining local relaxation time values from the MR images. The MR method described above can be implemented on the MR imaging device by means of suitable program control of the computer means. The method may be made available to the users of MR imaging devices in the form of a corresponding computer program. The computer program may be stored on suitable data carriers, such as CD-ROMs or floppy disks for example, or else it may be downloaded from the Internet onto the computer means of the MR imaging device.

The invention will be further described with reference to examples of embodiments shown in the drawings to which, however, the invention is not restricted.

DESCRIPTION

Figure 1:
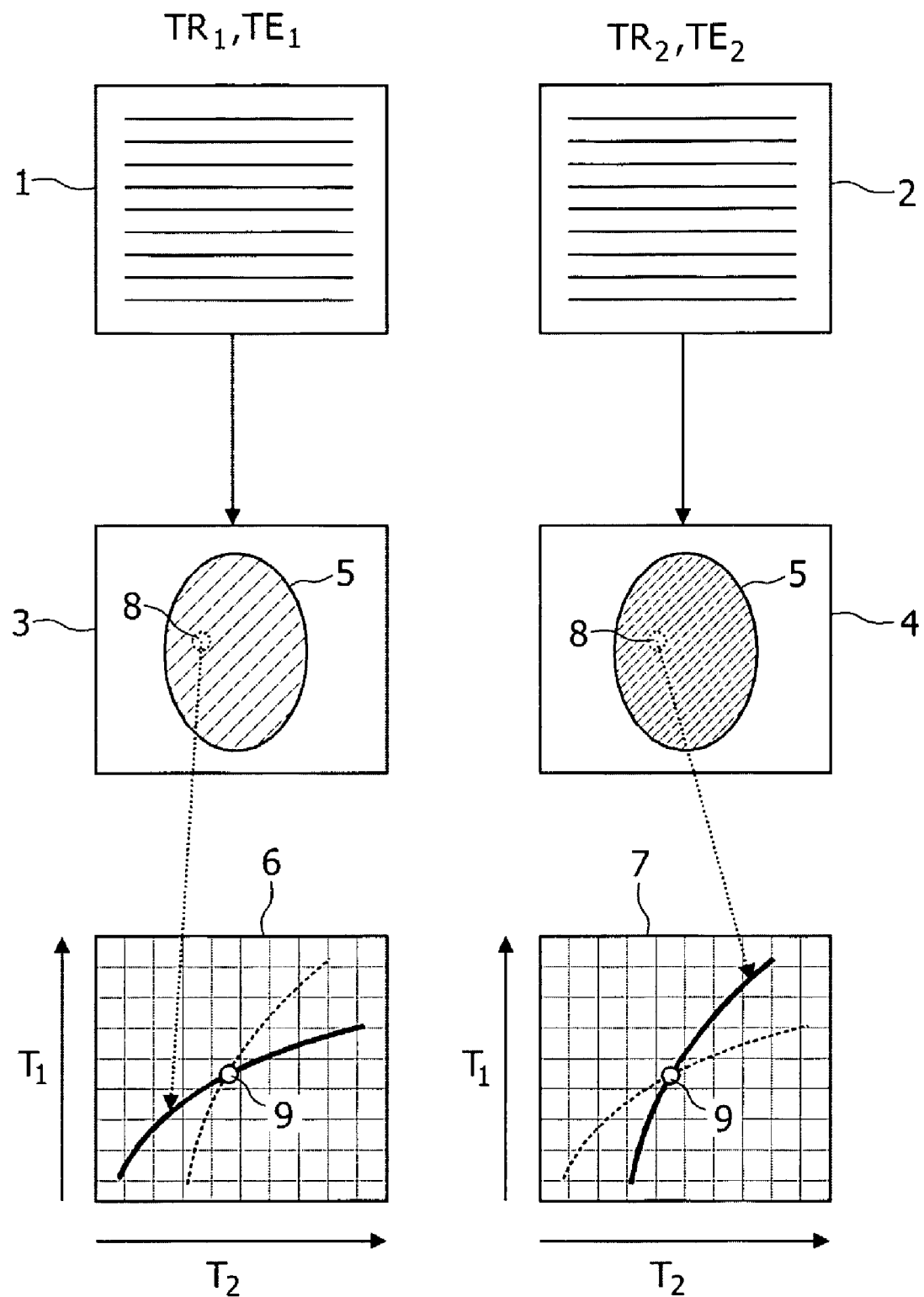
FIG. 1 shows a schematic diagram of the progress of the method according to the invention.

The method shown in FIG. 1 begins with the recording of two MR signal data records 1 and 2 with different time parameter sets of an imaging sequence. The data record 1 is recorded with the repetition time $TR_1$ and the echo time $TE_1$, whereas during the recording of the data record 2 the repetition time is $TR_2$ and the echo time is $TE_2$. MR images 3 and 4 are reconstructed from the data records 1 and 2, respectively. The MR images 3 and 4 show a slice representation of an examination object. Different gray stages can be seen in the images 3 and 4 according to the different time parameters $TR_1$, $TE_1$, $TR_2$, $TE_2$. For the same time parameters, MR images 6 and 7 of a phantom having a matrix-like distribution of relaxation time values $T_1$ and $T_2$ were recorded beforehand. Each row of the matrix is assigned a specific $T_1$ value and each column of the matrix is assigned a $T_2$ value. The matrix values $(M_1)_{i,j}$ and $(M_2)_{i,j}$ are obtained in accordance with the following formulae, since the MR images 1, 2 and 6, 7 are recorded by means of the imaging sequence used in a manner weighted by both longitudinal and transverse relaxation times:

$$(M_1)_{i,j} = M_0(1 - \exp(-TR_1/(T_1)_{i,j}))\exp(-2TE_1/(T_2)_{i,j}),$$

$$(M_2)_{i,j} = M_0(1 - \exp(-TR_2/(T_1)_{i,j}))\exp(-2TE_2/(T_2)_{i,j}).$$

$M_0$ represents the absolute value of the nuclear magnetization, which is in this case assumed to be constant, and $(T_1)_{i,j}$ and $(T_2)_{i,j}$ are the relaxation time values of the phantom. The local relaxation time values are to be determined for a region 8 of the examination object 5. To this end, firstly the gray value of the corresponding image point of the MR image 3 is compared with the gray values of the corresponding MR image 6 of the phantom. It can be seen that the image points lying on the continuous curve within the MR image 6 correspond to the image point 8 of interest of the MR image 3 in terms of the gray value. The value pairs $T_1$ and $T_2$ lying on this curve can be associated with the image value measured at the image point 8 of the MR image 3. In the next step, in a corresponding manner, the MR image 4 of the examination object 5 is compared with the MR image 7 of the phantom. In this comparison, too, a plurality of $T_1/T_2$ value pairs are found which may be associated with the image value of the image point 8. The corresponding value pairs are once again shown by a continuous curve in the MR image 7 of the phantom. A unique assignment of relaxation time values to the image point 8 is then possible by determining a point of intersection 9 of the two curves shown within the MR images 6 and 7. The image values at the image point 8 which are determined with the two different time parameter sets $TR_1$, $TE_1$ and $TR_2$, $TE_2$ can be associated with the $T_1/T_2$ value pair which is uniquely assigned to the point of intersection 9. The method described above can then be repeated for all the image points within the MR images 3 and 4 until all of the local relaxation time values of the examination object have been determined. Overall, only two MR images have to be recorded for this, and this takes up much less measurement time than the recording of 5 to 10 MR images which is customary in the conventional methods.

Figure 2:
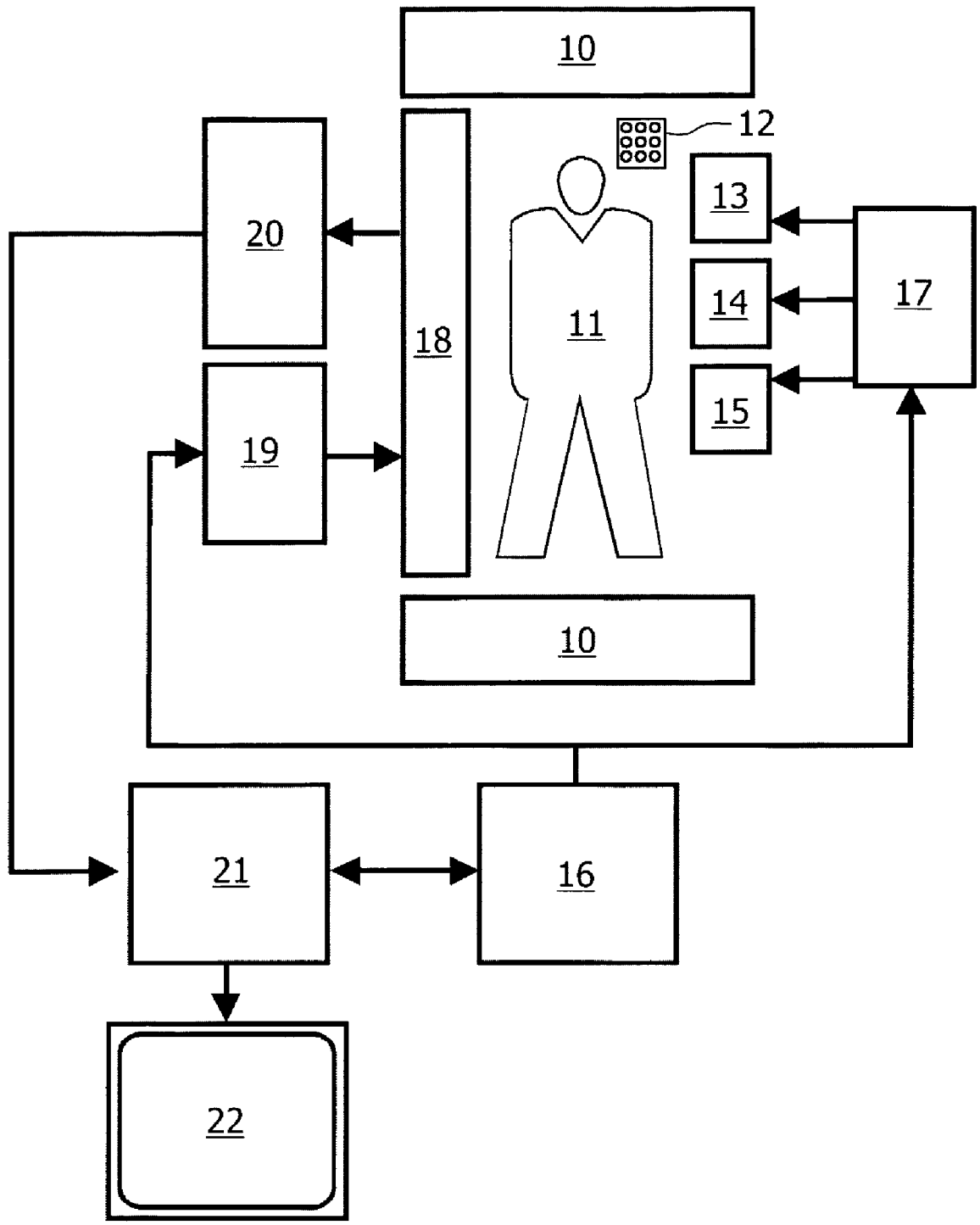
FIG. 2 shows an MR device according to the invention.

FIG. 2 shows a block diagram of an MR imaging device on which the method according to the invention can be carried out. The MR imaging device consists of a main field coil 10 for generating a homogeneous static magnetic field in an examination volume in which a patient 11 and a phantom 12 are located. The phantom 12 consists of a matrix-like arrangement of compartments in which solutions comprising different concentrations of a suitable contrast agent are located, for example a contrast agent based on gadolinium or a contrast agent containing iron oxide. The relaxation time values $T_1$ and $T_2$ can be accurately determined on the basis of the contrast agent concentration. A one-off precise measurement of the relaxation time values within the individual compartments with a suitable imaging sequence is necessary in order to calibrate the phantom. The MR imaging device furthermore has gradient coils 13, 14 and 15 for generating magnetic field gradients in different spatial directions within the examination volume. The temporal and spatial course of the magnetic field gradients within the examination volume is controlled by means of a central control unit 16, which is connected to the gradient coils 13, 14 and 15 via a gradient amplifier 17. The MR imaging device shown also comprises a high-frequency coil 18 for generating high-frequency fields in the examination volume and for receiving MR signals from the examination volume. The high-frequency coil 18 is connected to the control unit 16 via a transmitter unit 19. The MR signals recorded by the high-frequency coil 18 are demodulated and amplified by a receiver unit 20 and fed to a reconstruction and visualization unit 21. The high-frequency coil 18 together with the receiver unit 20 forms the recording means of the MR imaging device according to the invention. The control unit 16 and the reconstruction and visualization unit 21 are the computer means of the MR imaging device. The MR signals processed by the reconstruction and visualization unit 21 may be displayed on a screen 22. The reconstruction and visualization unit 21 and the control unit 16 have suitable program control for carrying out the method according to the invention.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. An MR method of determining local relaxation time values of an examination object, comprising the following method steps:
   a) recording and reconstructing two or more MR images of the examination object, each with different time parameter sets of an imaging sequence;
   b) recording and reconstructing MR images of a phantom with the same time parameter sets of the imaging sequence, wherein the phantom has a known spatial distribution of relaxation time values;
   c) determining local relaxation time values of the examination object by comparing image values of the MR images of the examination object with image values of the MR images of the phantom and by assigning image values of the MR images of the phantom to relaxation time values according to the known spatial distribution of relaxation time values of the phantom; and
   d) displaying at least one of the MR images adjusted based on the determined local relaxation time values.

2. The method as claimed in claim 1, wherein the MR images of the examination object and of the phantom are recorded at the same time.

3. The method as claimed in claim 1, wherein the phantom has spatially separate regions having different longitudinal relaxation time values and/or different transverse relaxation time values.

4. The method as claimed in claim 3, wherein the phantom has regions having different transverse and essentially identical longitudinal relaxation time values.

5. The method as claimed in claim 1, wherein, in order to record the MR images of the object and the MR images of the phantom, use is made of a spin echo imaging sequence.

6. A computer readable medium caring a software program which controls one or more computers of an MR imaging device to perform the method as claimed in claim 1.

7. The method as claimed in claim 1, wherein step (a) includes:
generating a first MR image using an imaging sequence with a first repeat time and a first echo time, the first image includes an array of pixels/voxels;
generating a second MR image using an imaging sequence with a second repeat time and a second echo time, the second repeat time being different from the first repeat time and the second echo time being different from the first echo time, the second image including an array of pixels/voxels.

8. The method as claimed in claim 7, wherein step (b) includes:
generating a first phantom image using the imaging sequence with the first repeat time and the first echo time; and
generating a second phantom image using the imaging sequence with the second repeat time and the second echo time.

9. The method as claimed in claim 8, wherein step (c) includes:
comparing image values of a common pixel/voxel of the first and second MR images with image values of the first phantom image and the second phantom image.

10. The method as claimed in claim 8, wherein step (c) includes:
comparing the image values of a selected pixel/voxel from the first MR image with image values of the first phantom image to generate a first set of phantom pixels/voxels;
comparing image values of the selected pixel/voxel from the second MR image with image values of the second phantom image to generate a second set of phantom pixels/voxels;
determining a common pixel/voxel in the first and second sets of phantom pixels/voxels;
determining the local relaxation time value of a segment of the phantom corresponding to the common pixel/voxel of the first and second sets of phantom pixels/voxels.

11. An MR method of determining local relaxation time values of an examination object, comprising:
a) recording and reconstructing two or more MR images of the examination object, each with different time parameter sets of an imaging sequence;
b) recording and reconstructing MR images of a phantom with the same time parameter sets of the imaging sequence, wherein the phantom has a known spatial distribution of relaxation time values;
the phantom having regions having at least one of:
different longitudinal and essentially identical transverse relaxation time values, and
different transverse and essentially identical longitudinal relaxation time values;
c) determining local relaxation time values of the examination object by comparing image values of the MR images of the examination object with image values of the MR images of the phantom and by assigning image values of the MR images of the phantom to relaxation time values according to the known spatial distribution of relaxation time values of the phantom; and
d) displaying at least one of the MR images corrected in accordance with the determined local relaxation time values.

12. The method as claimed in claim 11, wherein, in order to determine the relaxation time values, interpolation is carried out between the image values of the MR images between the phantom and the examination object.

13. The method as claimed in claim 11, wherein, in order to clearly determine the local relaxation time values, the image values of the MR images of the examination object and of the phantom are compared for all the time parameter sets of the imaging sequence.

14. The method as claimed in claim 11, wherein the MR images are recorded in a manner weighted by longitudinal and transverse relaxation times.

15. The method as claimed in claim 11, wherein at least three MR images of the examination object and of the phantom, which additionally has a known spatial distribution of nuclear spin density values, are recorded and reconstructed, and wherein, in addition to the local relaxation time values, local nuclear spin density values of the examination object are determined by comparing image values of the MR images of the examination object with image values of the MR images of the phantom and by assigning image values of the MR images of the phantom to nuclear spin density values according to the known spatial distribution of nuclear spin density values of the phantom.

16. An MR imaging system comprising:
a controller which controls an MR device to:
generate a first MR signal from an examined object using a first repeat time and a first echo time, and
a second MR signal from the examined object using a second repeat time and a second echo time, the second repeat time being different from the first repeat time and the second echo time being different from the first echo time; and
one or more computers programmed to:
reconstruct a first MR image from the first MR signal, and reconstruct a second MR image from the second MR signal, and
determine relaxation time values of a common voxel/pixel of the first and second MR images by comparing image values of the common voxel/pixel of the first and second MR images with image values of a first phantom image generated of a phantom having a known spatial distribution of relaxation time values with the first repeat time and the first echo time and with image values of a second phantom image generated of the phantom with the second repeat time and the second echo time.

17. The MR imaging system as claimed in claim 16, wherein the phantom has a matrix-like arrangement of compartments in which solutions comprising different concentrations of a contrast agent are located.

18. The MR imaging system as claimed in claim 16, wherein the phantom is configured to be imaged concurrently with the object.

* * * * *